United States Patent
Lee et al.

(10) Patent No.: US 9,030,871 B2
(45) Date of Patent: May 12, 2015

(54) INTEGRATED CIRCUIT WITH PROGRAMMABLE STORAGE CELL ARRAY AND BOOT-UP OPERATION METHOD THEREOF

(71) Applicant: SK Hynix Inc., Gyeonggi-do (KR)

(72) Inventors: Joo-Hyeon Lee, Gyeonggi-do (KR); Jun-Hyun Chun, Gyeonggi-do (KR); Ho-Uk Song, Gyeonggi-do (KR)

(73) Assignee: SK Hynix, Inc., Gyeonggi-do (KR)

( * ) Notice: Subject to any disclaimer, the term of this patent is extended or adjusted under 35 U.S.C. 154(b) by 12 days.

(21) Appl. No.: 13/969,212

(22) Filed: Aug. 16, 2013

(65) Prior Publication Data

US 2014/0313841 A1    Oct. 23, 2014

(30) Foreign Application Priority Data

Apr. 17, 2013  (KR) .................. 10-2013-0042202

(51) Int. Cl.
*G11C 11/56* (2006.01)
*G11C 7/20* (2006.01)
*G11C 5/14* (2006.01)
*G11C 29/44* (2006.01)

(52) U.S. Cl.
CPC ...... *G11C 7/20* (2013.01); *G11C 5/143* (2013.01); *G11C 2029/4402* (2013.01)

(58) Field of Classification Search
CPC .......... G11C 11/5628; G11C 11/5642; G11C 11/5621
USPC ....................... 365/185.03, 185.24
See application file for complete search history.

(56) References Cited

U.S. PATENT DOCUMENTS

| | | |
|---|---|---|
| 6,667,902 B2 | 12/2003 | Peng |
| 6,777,757 B2 | 8/2004 | Peng et al. |
| 6,904,751 B2 | 6/2005 | Makki et al. |
| 7,173,851 B1 | 2/2007 | Callahan et al. |
| 7,269,047 B1 | 9/2007 | Fong et al. |
| 2010/0265768 A1* | 10/2010 | Kasuga .................. 365/185.03 |
| 2011/0161578 A1 | 6/2011 | Kim et al. |

FOREIGN PATENT DOCUMENTS

KR    1019990021851    3/1999

* cited by examiner

*Primary Examiner* — Jason Lappas
(74) *Attorney, Agent, or Firm* — IP & T Group LLP

(57) ABSTRACT

An integrated circuit may include a first programmable storage cell group suitable for storing program validity information, second to N-th programmable storage cell groups suitable for storing a plurality of data, wherein N is an integer equal to or more than 3, and a validity determination unit suitable for determining whether the program validity information read from the first programmable storage cell group is valid or not so that read operations for the second to N-th programmable storage cell groups is performed or skipped based on the determined result.

9 Claims, 6 Drawing Sheets

INTEGRATED CIRCUIT WITH PROGRAMMABLE STORAGE CELL ARRAY AND BOOT-UP OPERATION METHOD THEREOF

CROSS-REFERENCE TO RELATED APPLICATIONS

The present application claims priority of Korean Patent Application No. 10-2013-0042202, filed on Apr. 17, 2013, which is incorporated herein by reference in its entirety.

BACKGROUND

1. Field

Exemplary embodiments of the present invention relate to an integrated circuit design, and more particularly, to a boot-up operation for a programmable storage cell array included in an integrated circuit.

2. Description of the Related Art

FIG. 1 is a block diagram illustrating a conventional memory device performing a repair operation.

Referring to FIG. 1, the memory device includes a memory cell array 110, a row circuit 120, and a column circuit 130. The memory cell array 110 includes a plurality of memory cells. The row circuit 120 is configured to activate a row (or a word line) selected by a row address R_ADD. The column circuit 130 is configured to access, for example, read or write, data of a column (or a bit line) selected by a column address C_ADD.

A row fuse circuit 140 is configured to store a row address corresponding to a defective memory cell within the memory cell array 110 as a repair row address REPAIR_R_ADD. A row comparator 150 is configured to compare the repair row address REPAIR_R_ADD stored in the row fuse circuit 140 to a row address R_ADD inputted from the outside the memory device. When the repair row address REPAIR_R_ADD is identical with the row address R_ADD, the row comparator 150 controls the row circuit 120 to activate a redundancy row (or a redundancy word line) instead of a row designated by the row address R_ADD.

A column fuse circuit 160 is configured to store a column address corresponding to a defective memory cell within the memory cell array 110 as a repair column address REPAIR_C_ADD. A column comparator 170 is configured to compare the repair column address REPAIR_C_ADD stored in the column fuse circuit 160 with a column address C_ADD inputted from the outside the memory device. When the repair column address REPAIR_C_ADD is identical with the column address C_ADD, the column comparator 170 controls the column circuit 130 to access a redundancy column (or a redundancy bit line) instead of a column designated by the column address C_ADD. For reference, in the FIG. 1, "DATA" denotes data or data pads.

Conventionally, laser fuses has been mainly used as the fuse circuits 140 and 160. The laser fuse stores a logic high data or a logic low data depending on whether the fuse is cut or not. The laser fuse may be programmed in a wafer state, and may not be programmed after a wafer is mounted in a package. Furthermore, the laser fuses may not be designed with a small area due to the limit in a line pitch.

In order to overcome such concerns, as disclosed in U.S. Pat. Nos. 6,904,751, 6,777,757, 6,667,902, 7,173,851, and 7,269,047, programmable storage cell array circuit, such as an E-fuse array circuit, a NAND flash memory, a NOR flash memory, a magnetic random access memory (MRAM), a spin transfer torque magnetic random access memory (STT-MRAM), a resistive random access memory (ReRAM), or a phase change random access memory (PCRAM), is included into the memory device, and repair information, including, for example, fail addresses, is stored in the programmable storage cell array circuit.

FIG. 2 is a block diagram illustrating a conventional memory device including a programmable storage cell array circuit for storing repair information.

Referring to FIG. 2, the memory device includes a plurality of memory banks BK0 to BK3, a plurality of register units 210_0 to 210_3 provided for the respective memory banks BK0 to BK3 to store repair information, and a programmable storage cell array circuit 201.

The programmable storage cell array circuit 201 replaces the fuse circuits 140 and 160 shown in FIG. 1. The programmable storage cell array circuit 201 stores the repair information corresponding to all of the memory banks BK0 to BK3, including, for example, fail addresses. The programmable storage cell array circuit 201 may include any one of an E-fuse array circuit, a NAND flash memory, a NOR flash memory, an MRAM, a STT-MRAM, a ReRAM, and a PCRAM.

The register units 210_0 to 210_3 provided for the respective memory banks BK0 to BK3 may store the repair information to be stored in the corresponding memory banks. The register unit 210_0 may store the repair information regarding the memory bank. BK0, and the register unit 210_2 may store the repair information regarding the memory bank BK2. The register units 210_0 to 210_3 each may include latch circuits, and may store the repair information only while power is supplied. The repair information to be stored in the register units 210_0 to 210_3 may be transmitted from the programmable storage cell array circuit 201. The programmable storage cell array circuit 201 transmits the repair information stored from the time of activation of a boot-up enable signal BOOTEN to the register units 210_0 to 210_3.

Since the programmable storage cell array circuit 201 is configured in an array form, a predetermined time is required to call data stored in the programmable storage cell array circuit 201. Since the data may not be immediately called, the data stored in the programmable storage cell array circuit 201 may not be directly used to perform a repair operation. Thus, the repair information stored in the programmable storage cell array circuit 210 is transmitted and stored into the register units 210_0 to 210_3, and the data stored in the register units 210_0 to 210_3 are used for the repair operation of the memory banks BK0 to BK3. An operation of transmitting the repair information stored in the programmable storage cell array circuit 201 to the register units 210_0 to 210_3 is referred to as a boot-up operation. After the boot-up operation is completed, the memory device may repair a defective cell, and start performing a normal operation.

The boot-up operation is performed while an operation of reading data stored in the programmable storage cell array circuit 201 is repeated a predetermined number of times. For example, several to tens of thousands of read operations is to be performed according to the capacity of the programmable storage cell array circuit 201 and the capacities of the register units 210_0 to 210_3 until the boot-up operation is completed. Since the boot-up operation is to be completed for the memory device to normally operate, it may be important to reduce the time of the boot-up operation.

SUMMARY

Various embodiments are directed to an integrated circuit for reducing the time of a boot-up operation to sequentially read data stored in a programmable storage cell array.

In an embodiment, an integrated circuit may include a first programmable storage cell group suitable for storing program validity information, second to N-th programmable storage cell groups suitable for storing a plurality of data, wherein N is an integer equal to or more than 3, and a validity determination unit suitable for determining whether the program validity information read from the first programmable storage cell group is valid or not so that read operations for the second to N-th programmable storage cell groups is performed or skipped based on the determined result.

In an embodiment, An integrated circuit may include a programmable storage cell array having a plurality of cell blocks, wherein each of the cell blocks includes a specified cell page suitable for being programmed with program validity information of the corresponding cell block, and normal cell pages suitable for being programmed with normal information, and a validity determination unit suitable for reading the program validity information of the corresponding cell block and determining whether to skip read operations for the normal cell pages of the corresponding cell block based on the read program validity information.

In an embodiment, an operation method of an integrated circuit with a programmable storage cell array, the operation method may include reading first program validity information programmed in a first programmable storage cell group included in the programmable storage cell array, determining whether to perform read operations for second to N-th programmable storage cell groups included in the programmable storage cell array based on the first program validity information, wherein N is an integer equal to or more than 3 and sequentially reading data programmed in the second to N-th programmable storage cell groups, when the first program validity information of is valid.

DETAILED DESCRIPTION

Figure 1:
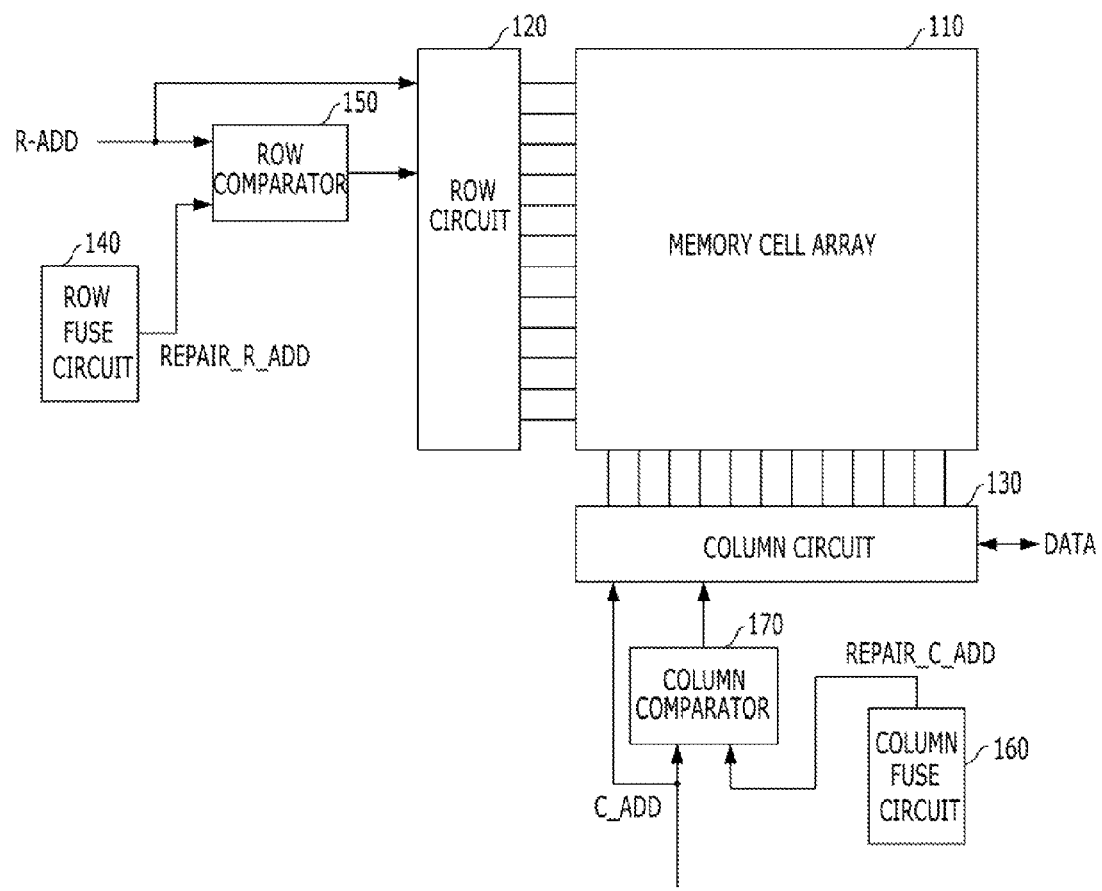
FIG. 1 is a block diagram illustrating a conventional memory device performing a repair operation.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Throughout the disclosure, reference numerals correspond directly to the like numbered parts in the various figures and embodiments of the present invention.

It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 3:
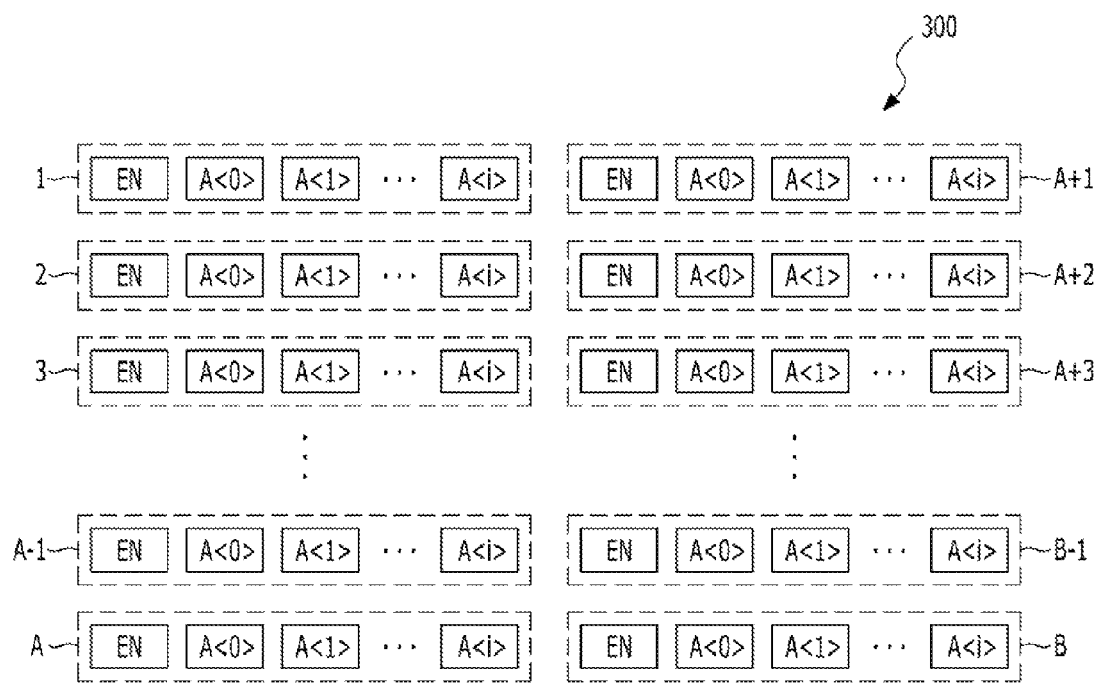
FIG. 3 is a diagram illustrating a programmable storage cell array included in the programmable storage cell array circuit.

FIG. 3 is a diagram illustrating a programmable storage cell array included in the programmable storage cell array circuit.

Referring to FIG. 3, the programmable storage cell array 300 includes a plurality of programmable storage cells, for example, E-fuse cells, arranged in a plurality of rows and columns, and a predetermined number of programmable storage cells, for example, a page of programmable storage cells, form one programmable storage cell group. FIG. 3 illustrates that each of the programmable storage cell groups 1 to A and A+1 to B includes (i+2) programmable storage cells. The number of programmable storage cells included in one programmable storage cell group may be equal to the bit number of data which may be read during one read operation.

Each of the programmable storage cell groups 1 to A and (A+1) to B stores a fail address A<0:i> composed of (i+1) bits and program validity information EN. The fail address A<0:i> refers to an address indicating the position of a defective cell required to be repaired. The fail address A<0:i> may include a column address or a row address. The program validity information EN indicates whether the data, for example, fail address, stored in a corresponding programmable storage cell group is valid or not. When the program validity information EN is 1, the fail address A<0:i> stored in the programmable storage cell group is recognized as an address to indicate the position of a defective cell required to be repaired. When the program validity information EN is 0, the fail address A<0:i> stored in the programmable storage cell group is invalid information, and thus may be ignored. That is, repair is not needed.

Figure 2:
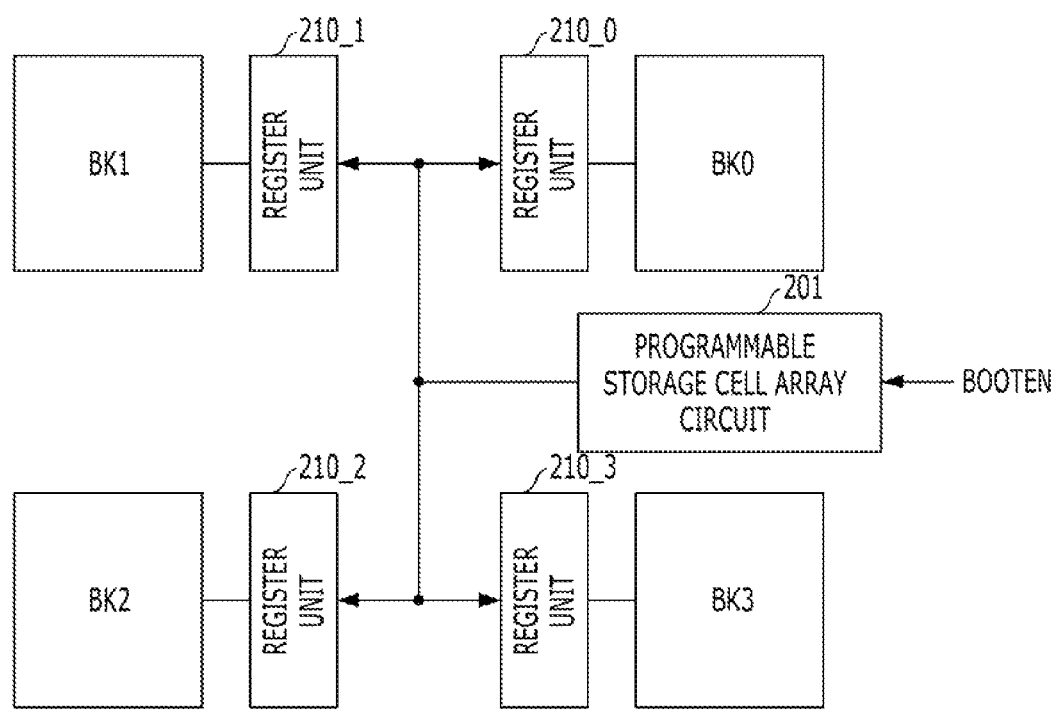
FIG. 2 is a block diagram illustrating a conventional memory device including a programmable storage cell array circuit for storing repair information.

During a boot-up operation, read operations for the programmable storage cell groups 1 to B within the programmable storage cell array 300 are sequentially performed. For example, the read operation for the programmable storage cell group 1 is first performed, and the read operation for the programmable storage cell group 2 is then performed. Similarly, the read operations for the programmable storage cell groups 3 to B are sequentially performed, Furthermore, data (fail addresses) outputted from the programmable storage cell array by the plurality of read operations are transmitted to register units, for example, the register units 210_0 to 210_3 shown in FIG. 2, and then used for a repair operation.

In order to complete the boot-up operation, a predetermined number of read operations is to be performed, the predetermined number corresponding to the number of programmable storage cell groups. Thus, as the amount of information transmitted to the register units from the programmable storage cell array during boot-up increases, that is, as the number of programmable storage cell groups increases, the time required for the boot-up operation continuously increases.

Figure 4:
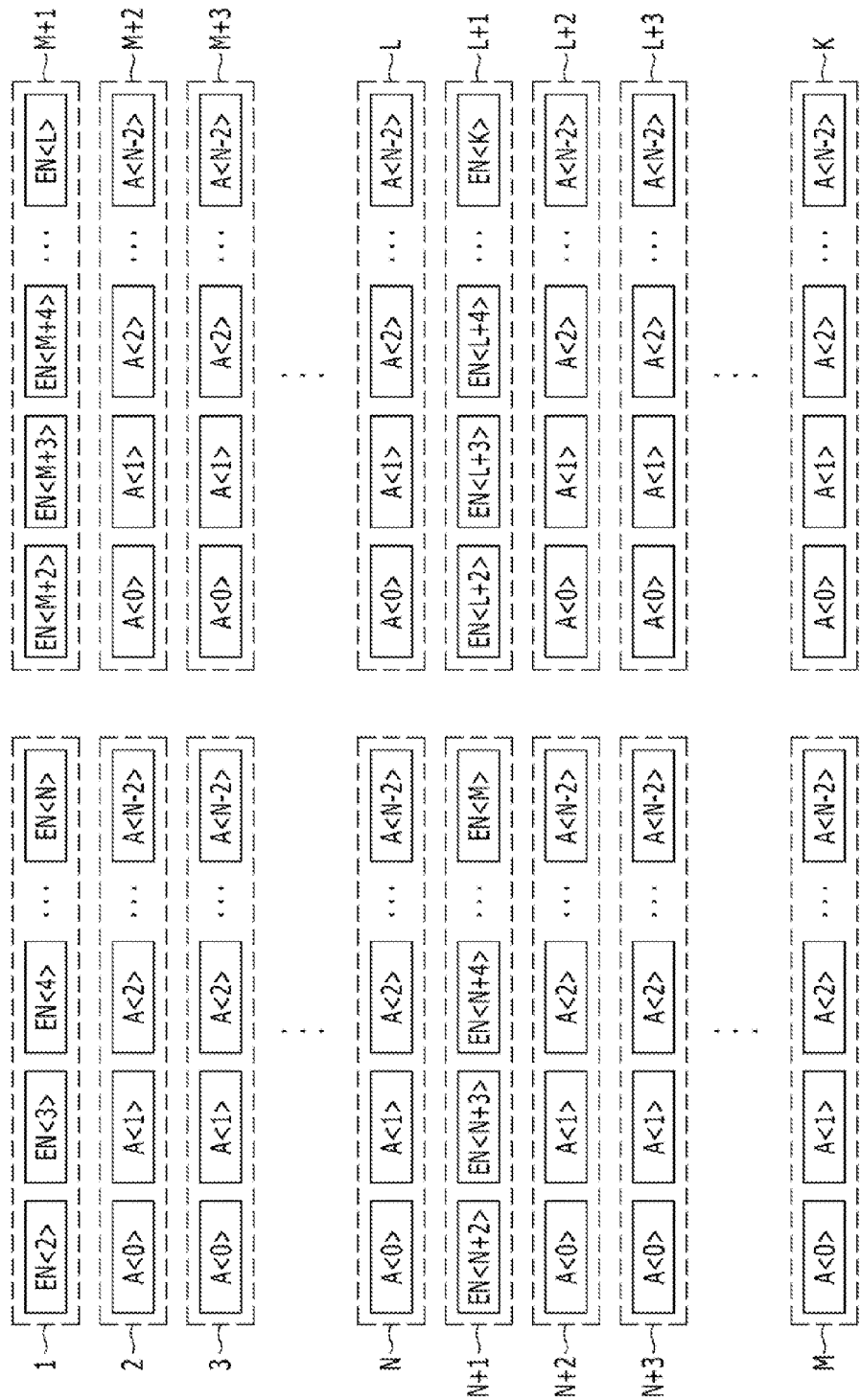
FIG. 4 is a diagram illustrating a programmable storage cell array in accordance with the embodiment of the present invention.

FIG. 4 is a diagram illustrating the programmable storage cell array in accordance with the embodiment of the present invention.

Referring to FIG. 4, a programmable storage cell array 400 included in the programmable storage cell array circuit includes a plurality of programmable storage cells, for example, E-fuse cells, arranged in a plurality of rows and columns, and a predetermined number of programmable storage cells, for example, a page of programmable storage cells, form one programmable storage cell group. FIG. 4 illustrates that each of programmable storage cell groups 1 to N, N+1 to M, M+1 to L, and L+1 to K includes (N−1) programmable storage cells. The number of programmable storage cells included in one programmable storage cell group may be equal to the bit number of data which may be read during one read operation, for example, a page.

The programmable storage cell group 1 stores plural pieces of program validity information EN<2> to EN<N> corresponding to the respective memory groups 2 to N. The program validity information EN<2> indicates the validity of data, for example, fail address, stored in the programmable storage cell group 2, and the program validity information EN<3> indicates the validity of data stored in the programmable storage cell group 3. Similarly, the program validity information EN<N> indicates the validity of data stored in the programmable storage cell group N. Each of the programmable storage cell groups 2 to N stores a fail address A<0:N−2>. FIG. 4 illustrates that the fail address A<0:N−2> stored in the programmable storage cell groups 2 to N has (N−1) bits. The relationship between the programmable storage cell group N+1 and the programmable storage cell groups N+2 to M is identical to the relationship between the programmable storage cell group 1 and the programmable storage cell groups 2 to N. The programmable storage cell group N+1 stores plural pieces of program validity information EN<N+2> to EN<M> corresponding to the respective programmable storage cell groups N+2 to M, and each of the programmable storage cell groups N+2 to M stores a fail address A<0:N−2>. The relationship between the programmable storage cell group M+1 and the programmable storage cell groups M+2 to L and the relationship between the programmable storage cell group L+1 and the programmable storage cell groups L+2 to K are also identical to the relationship between the programmable storage cell group 1 and the programmable storage cell groups 2 to N.

During the boo up operation, all pieces of valid information stored in the programmable storage cell array must be transmitted to registers. Thus, when the information configured in the form illustrated in FIG. 3 is stored in the programmable storage cell array, the read operations for all of the programmable storage cell groups 1 to B must be performed. However, when the respective pieces of program validity information are stored in the programmable storage cell groups 1, (N+1), (M+1), and (L+1), read operations for some programmable storage cell groups may be skipped during the boot-up operation. This will be described below in detail.

Figure 5:
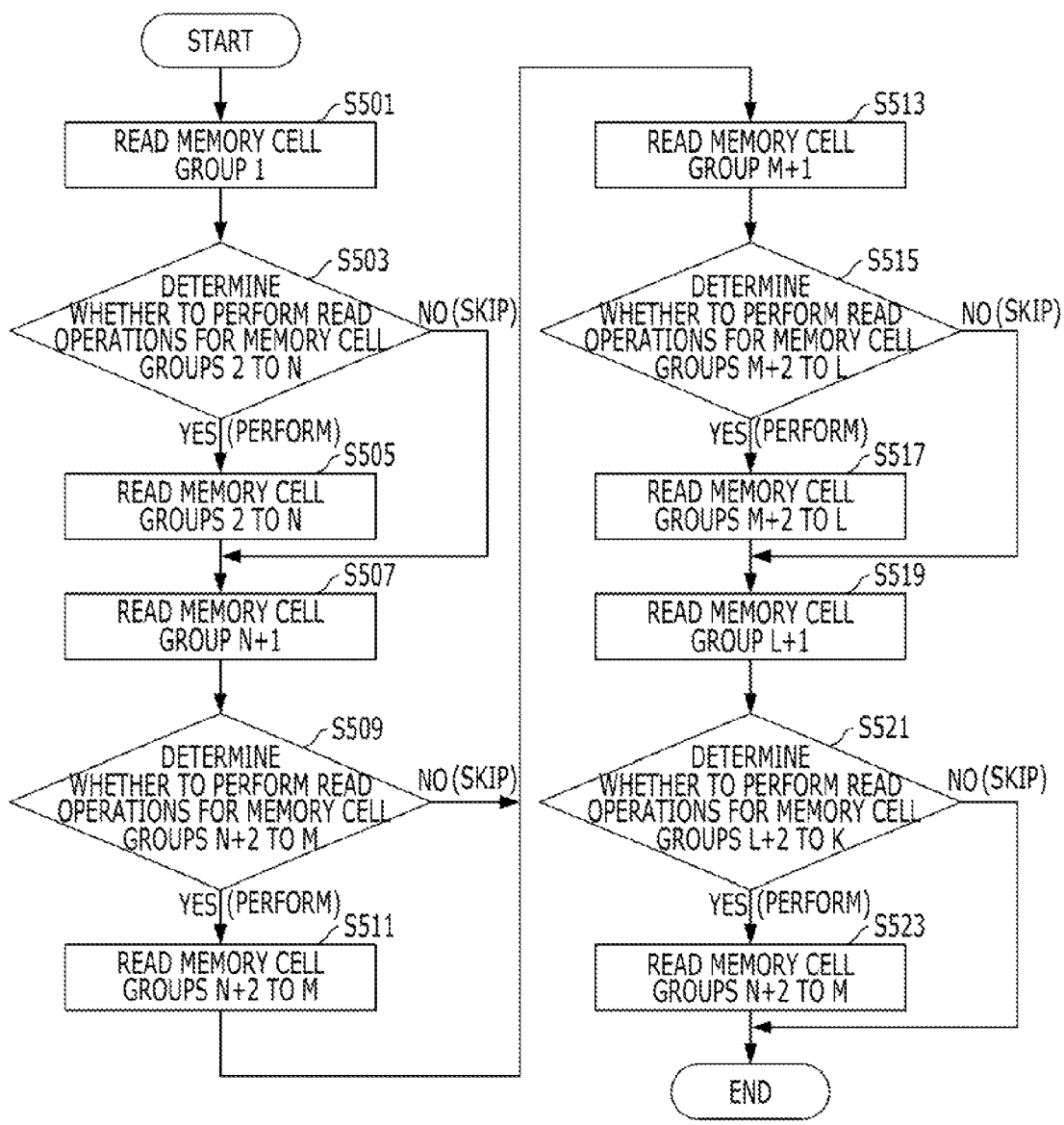
FIG. 5 is a flowchart illustrating a process for a boot-up operation in accordance with the embodiment of the present invention.

FIG. 5 is a flowchart illustrating a process in which a programmable storage cell array including information stored in the form of FIG. 4 performs a boot-up operation.

Referring to FIG. 5, a read operation for the programmable storage cell group 1 is performed at step S501. Through the read operation for the programmable storage cell group 1, it is possible to determine the validities of the respective pieces of information stored in the programmable storage cell groups 2 to N. Then, based on the program validity information EN<2> to EN<N> obtained at the read operation at step S501, whether or not to perform read operations for the programmable storage cell groups 2 to N is determined at step S503. When all the pieces of program validity information EN<2> and EN<N> have an invalid value, for example, logic '0', the read operations for the programmable storage cell groups 2 to N do not need to be performed. Thus, the read operations for the programmable storage cell groups are skipped, that is, the procedure proceeds to step S507. When one or more pieces of information EN<2> to EN<N> have a valid value, for example, logic '1', it is determined that the read operations for the programmable storage cell groups 2 to N should be performed. In this case, the read operations for the programmable storage cell groups 2 to N are sequentially performed at step S505. After all of the read operations are performed, the procedure proceeds to step S507.

The read operations for the programmable storage cell groups N+1 to M are performed in the same manner as the read operations for the programmable storage cell groups 1 to N. First, the read operation for the programmable storage cell group N+1 is performed at step S507, and the respective pieces of program validity information EN<N+2> to EN<M> obtained through the read operations are used to determine whether to perform or skip the read operations for the programmable storage cell groups N+2 to M at step S509. The read operations for the programmable storage cell groups M+1 to L and the programmable storage cell groups L+1 to K are also performed in the same manner as the read operations for the programmable storage cell groups 1 to N.

According to the boot-up operation of FIG. 5, the read operations for all of the programmable storage cell groups are not performed during the boot-up operation, but read operations for unnecessary programmable storage cell groups may be skipped. Thus, it may be possible to reduce the time and current required for the boot-up operation.

Figure 6:
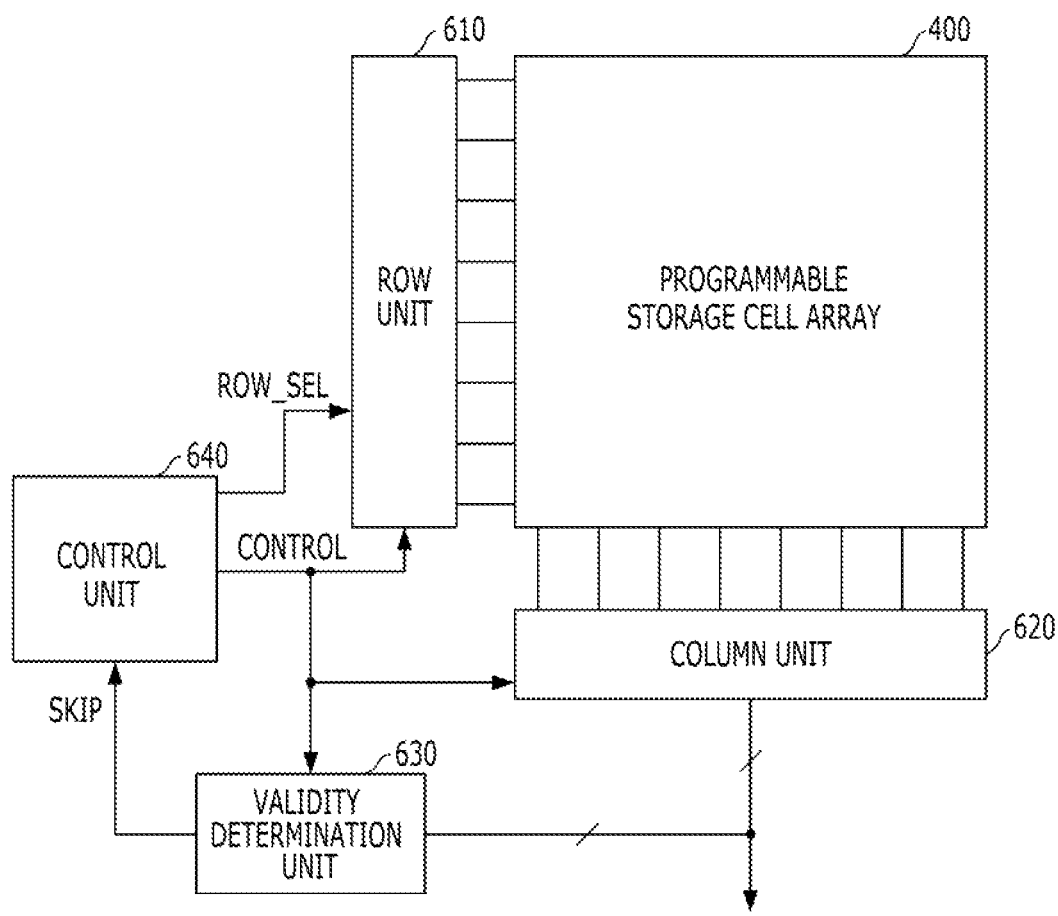
FIG. 6 is a block diagram illustrating a programmable storage cell array circuit including a programmable storage cell array shown in FIG. 4.

FIG. 6 is a block diagram illustrating a programmable storage cell array circuit including the programmable storage cell array 400 shown in FIG. 4, and performing a boot-up operation in the manner as described with reference to FIG. 5.

Referring to FIG. 6, the programmable storage cell array circuit may include the programmable storage cell array 400, a row unit 610, a column unit 620, a validity determination unit 630, and a control unit 640.

The programmable storage cell array 400 may include a plurality of programmable storage cells arranged in a plurality of rows and columns, and a predetermined number of programmable storage cells, for example, a page of programmable storage cells, form one programmable storage cell group. Programmable storage cells within one programmable storage cell group may be simultaneously read during one read operation. Since the programmable storage cell groups 1 to N, N+1 to M, M+1 to L, and L+1 to K and the form of the information stored therein have been described in detail with reference to FIG. 4, the detailed descriptions thereof are omitted herein.

The row unit 610 is configured to select one row among a number of rows with the programmable storage cell array 400 in response to a row selection signal ROW_SEL. For example, among N rows belonging to the programmable storage cell groups 1 to N of the programmable storage cell array 400, a third row belonging to the programmable storage cell group 3 may be selected by the row unit 610.

The column unit 620 is configured to read data from columns, for example, the columns selected by a column selection information generated from control unit 640, among a number of columns within the programmable storage cell array 400. Among the columns within the programmable storage cell array 400, a plurality of columns may be selected by the column address COL_ADD. For example, when (2N−2) columns are arranged in the programmable storage cell array as illustrated in FIG. 4, (N−1) columns may be selected by the column selection information.

The validity determination unit 630 is configured to receive data read by the column unit 620 when read operations for the programmable storage cell groups 1, N+1, M+1, and L+1 storing plural pieces of program validity information EN<X> are performed during the boot-up operation, and determine whether or not to perform read operations for the other programmable storage cell groups. The validity determination unit 630 activates a skip signal SKIP when the transmitted pieces of program validity information EN<X> are invalid, and deactivates the skip signal SKIP when one or more of the transmitted pieces of program validity information EN<X> are valid. For example, when the read operation for the programmable storage cell group 1 is performed, the validity determination unit 630 receives the program validity information EN<2> to EN<N> read from the programmable storage cell group 1, and when all the pieces of program validity information EN<2> to EN<M> are '0', the validity determination unit 630 activates the skip signal SKIP, but otherwise deactivates the skip signal SKIP.

The control unit 640 controls the row unit 610, the column unit 620, and the validity determination unit 630 to perform the boot-up operation of the programmable storage cell array in such a manner as illustrated in FIG. 5. In FIG. 6, CONTROL represents the operation of the control unit 640 to control the units 610, 620, and 630. During the boot-up operation, the control unit 640 supplies addresses ROW_ADD and COL_ADD to the row unit 610 and the column unit 620 and controls the row unit 610 and the column unit 620 to perform a read operation for the programmable storage cell group 1. Furthermore, the control unit 640 controls the validity determination unit 630 to receive the program validity information EN<2> to EN<N> read from the programmable storage cell group 1. When the skip signal SKIP is activated, the control unit 640 supplies addresses ROW_ADD and COL_ADD to the row unit 610 and the column unit 620 and controls the row unit 610 and the column unit 620 to omit read operations for the programmable storage cell groups 2 to N and perform a read operation for the programmable storage cell group N+1. When the skip signal SKIP is deactivated, the control unit 640 supplies addresses ROW_ADD and COL_ADD and controls the row unit 610 and the column unit 620 to sequentially perform read operations for the programmable storage cell groups 2 to N. The control unit 640 performs the row unit 610 and the column unit 620 to perform read operations for the other programmable storage cell groups N+1 to M, M+1 to L, and L+1 to K in the same manner as the read operations for the programmable storage cell groups 1 to N (refer to FIG. 5).

The programmable storage cell array may include any kinds of memories each having a plurality of programmable storage cells arranged in a plurality of rows and columns. For example, the programmable storage cell array may include any one of an E-fuse array circuit, a NAND flash memory, a NOR flash memory, a MRAM, a STT-MRAM, a ReRAM, and a PCRAM.

In the embodiments of the present invention, it has been described that the programmable storage cell array is used for a repair operation of the memory device and the information stored in the programmable storage cell array (that is, information transmitted to the register units during boot-up) is a fail address. However, the present invention is not limited thereto. The present invention not only may be applied to a programmable storage cell array provided for a repair operation, but may be applied to a programmable storage cell array which stores information required for boot-up in any integrated circuits. At this time, the boot-up operation indicates an operation in which data are transmitted to register units from a programmable storage cell array storing information required for an operation of an integrated circuit.

In accordance with the embodiments of the present invention, it may be possible to omit an unnecessary read operation during a boot-up operation, thereby reducing the time and current consumption required for the boot-up operation.

Although various embodiments have been described for illustrative purposes, it will be apparent to those skilled in the art that various changes and modifications may be made without departing from the spirit and scope of the invention as defined in the following claims.

What is claimed is:

1. An integrated circuit comprising:
a first programmable storage cell group suitable for storing program validity information;
second to N-th programmable storage cell groups suitable for storing a plurality of data, wherein N is an integer equal to or more than 3; and
a validity determination unit suitable for determining whether the program validity information read from the first programmable storage cell group is valid or not so that read operations for the second to N-th programmable storage cell groups is performed or skipped based on the determined result.

2. The integrated circuit of claim 1, wherein when the program validity information determined by the validity determination unit are invalid, the read operations for the second to N-th programmable storage cell groups are skipped.

3. The integrated circuit of claim 1, wherein when the program validity information are valid, the read operations for the second to N-th programmable storage cell groups are sequentially performed.

4. The integrated circuit of claim 1, wherein the number of programmable storage cells belonging to each of the first to N-th programmable storage cell groups is equal to the number of data to be read in one read operation.

5. The integrated circuit of claim 1, wherein the first to N-th programmable storage cell groups are included in any one of an E-fuse array circuit, a NAND flash memory, a NOR flash memory, a magnetic random access memory, a spin transfer torque magnetic random access memory, a resistive random access memory, and a phase change random access memory.

6. The integrated circuit of claim further comprising:
a row control unit suitable for selecting a programmable storage cell group to be read;
a column control unit suitable for outputting the program validity information or the data from the selected programmable storage cell group;
a control unit suitable for controlling the validity determination unit, the row control unit, and the column control unit in response to a skip signal, wherein the skip signal denotes whether the read operations for the second to N-th programmable storage cell groups are to be performed or skipped and generated by the validity determination unit based on the determination result.

7. An integrated circuit comprising:
a programmable storage cell array having a plurality of cell blocks, wherein each of the cell blocks includes a specified cell page suitable for being programmed with program validity information of the corresponding cell block, and normal cell pages suitable for being programmed with normal information; and
a validity determination unit suitable for reading the program validity information of the corresponding cell block and determining whether to skip read operations for the normal cell pages of the corresponding cell block based on the read program validity information.

8. The integrated circuit of claim 7, wherein the programmable storage cell array includes an E-fuse array.

9. The integrated circuit of claim 7, wherein the validity determination unit activates a skip signal for controlling the read operations for the normal cell pages of the corresponding cell block to be skipped, when the read program validity information is invalid.

\* \* \* \* \*